(12) United States Patent
Cool

(10) Patent No.: US 10,447,264 B2
(45) Date of Patent: Oct. 15, 2019

(54) OPERATING ELEMENT AND APPLIANCE PROVIDED THEREWITH

(71) Applicant: Intergas Heating Assets B.V., Coevorden (NL)

(72) Inventor: Peter Jan Cool, Lochem (NL)

(73) Assignee: INTERGAS HEATING ASSETS B.V., Coevorden (NL)

( * ) Notice: Subject to any disclaimer, the term of this patent is extended or adjusted under 35 U.S.C. 154(b) by 0 days.

(21) Appl. No.: 16/060,441

(22) PCT Filed: Jan. 3, 2017

(86) PCT No.: PCT/NL2017/050002
§ 371 (c)(1),
(2) Date: Jun. 8, 2018

(87) PCT Pub. No.: WO2017/119810
PCT Pub. Date: Jul. 13, 2017

(65) Prior Publication Data
US 2018/0358966 A1    Dec. 13, 2018

(30) Foreign Application Priority Data

Jan. 7, 2016   (NL) .................................... 2016064

(51) Int. Cl.
*H03K 17/96*   (2006.01)
*F24D 19/10*   (2006.01)
(Continued)

(52) U.S. Cl.
CPC .......... *H03K 17/9625* (2013.01); *F21V 11/02* (2013.01); *F21V 23/0485* (2013.01);
(Continued)

(58) Field of Classification Search
CPC ..... H03K 17/9625; H03K 2217/96015; H03K 2217/96042; F21V 11/02; F21V 23/0485;
(Continued)

(56) References Cited

U.S. PATENT DOCUMENTS

| | | | |
|---|---|---|---|
| 2002/0116959 A1* | 8/2002 | Ohta ..................... | D06F 39/005 68/12.27 |
| 2009/0107829 A1* | 4/2009 | Heimann ............. | H03K 17/962 200/600 |

(Continued)

FOREIGN PATENT DOCUMENTS

EP      1640837 A2    3/2006

OTHER PUBLICATIONS

PCT International Search Report and Written Opinion; PCT/NL2017/050002, dated Mar. 23, 2017.
(Continued)

*Primary Examiner* — Mary Ellen Bowman

(57) ABSTRACT

A domestic appliance has an operating element, the operating element comprising a carrier, at least one pressure sensor configured for detection of an operation of the operating element, and at least one light source. A control is configured to switch the light source on or off subject to a sensor signal coming from the pressure sensor. At least one light conductor is arranged close to the light source and is configured to conduct light from the light source to at least a side of the light conductor remote from the carrier. Provided on or close to the side of the light conductor remote from the carrier is a screen comprising at least one opaque part and at least one translucent part, which together form a symbol.

20 Claims, 3 Drawing Sheets

(51) Int. Cl.
| | |
|---|---|
| *G06F 3/0362* | (2013.01) |
| *H03K 17/965* | (2006.01) |
| *F21V 11/02* | (2006.01) |
| *F21V 23/04* | (2006.01) |
| *F21V 31/00* | (2006.01) |
| *F21V 33/00* | (2006.01) |
| *F21W 131/30* | (2006.01) |

(52) U.S. Cl.
CPC ........ *F21V 31/005* (2013.01); *F21V 33/0044* (2013.01); *F24D 19/1051* (2013.01); *G06F 3/0362* (2013.01); *H03K 17/96* (2013.01); *H03K 17/965* (2013.01); *F21W 2131/30* (2013.01); *H03K 2217/96015* (2013.01); *H03K 2217/96042* (2013.01); *H03K 2217/9653* (2013.01); *H03K 2217/9655* (2013.01)

(58) Field of Classification Search
CPC ............... F21V 31/005; F21V 33/0044; F24D 19/1051; F21W 2131/30
See application file for complete search history.

(56) References Cited

U.S. PATENT DOCUMENTS

2010/0156508 A1* 6/2010 Yato ........................ G06F 1/165
  327/517
2012/0106051 A1* 5/2012 Fluhrer ................ H03K 17/964
  361/679.01

OTHER PUBLICATIONS

International Preliminary Report on Patentability (IPRP), PCT/NL2017/050002, dated May 8, 2018.

* cited by examiner

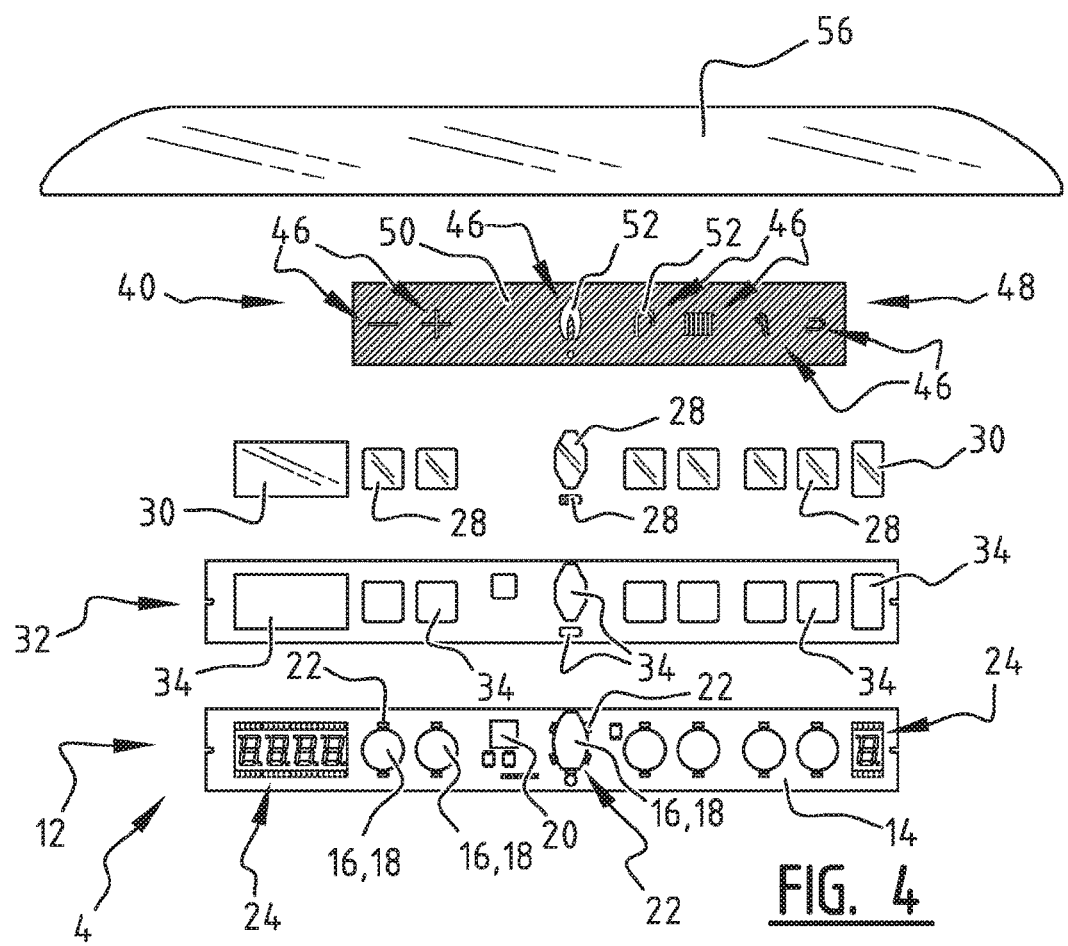
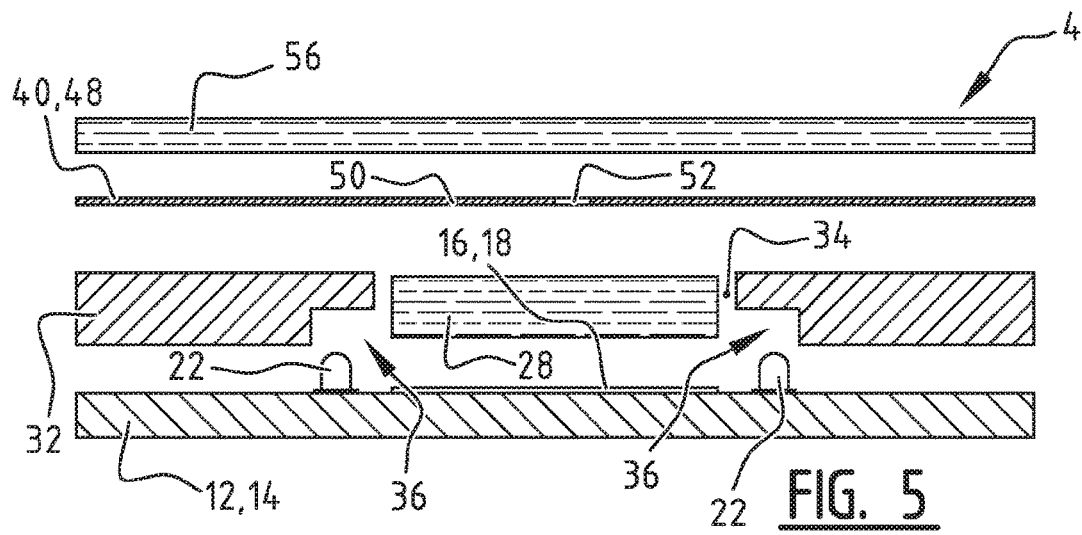

OPERATING ELEMENT AND APPLIANCE PROVIDED THEREWITH

This is a national stage application filed under 35 U.S.C. 371 of pending international application PCT/NL2017/050002, filed Jan. 3, 2017, which claims priority to Netherlands national patent application NL 2016064, filed Jan. 7, 2016, the entirety of which applications are incorporated by reference herein.

The invention relates to an operating element and to a (domestic) appliance provided with such an operating element. An example of a domestic appliance in which the operating element is applicable is a hot water appliance or a thermostat therefor.

Many (consumer) products are provided with screens on which information is displayed to the user. High-end screens, as for instance applied in smart phones and tablets, are touch-sensitive. A touch-sensitive screen can display a user interface adapted to the situation, wherein the screen itself can function as operating element.

For many (consumer) products there is a desire to give the product a high-quality look. Because the cost price of many products must however be as low as possible, there is insufficient margin to integrate actual high-end electronics (such as in a smart phone) solely for the client experience. There is thus a frequent need for a high-end look and feel at a low-end cost price, which are seemingly conflicting requirements. High-end electronics are moreover often vulnerable, which is a drawback for many products.

Applicant is a manufacturer of heating boilers, and there is also a desire for these products to be given a high-end look without having to integrate complex and vulnerable electronics. There is therefore a need for an operating element which combines robustness with a high-quality look.

The American patent application US-A1-2010/156508 is recognized as prior art from a far-removed technical field. It discloses an electronic device such as a laptop, mobile telephone or remote control with keys which can be operated and lit up capacitively. Such a capacitive operation is unsuitable for application in domestic appliances, such as hot water appliances, due to its vulnerability and sensitivity. The construction is on the one hand vulnerable due to the openings between the individual keys, this making the construction unsuitable for domestic application, particularly for hot water appliances. On the other hand, a slight touch may cause an unintended activation or deactivation.

The European patent application EP-A2-1 640 837 is recognized as further prior art.

The invention now has for its object to provide an operating element of the above described type, wherein said drawbacks do not occur, or at least do so to lesser extent.

Said object is achieved according to the invention with a domestic appliance with an operating element, the operating element comprising:
- a carrier, at least one pressure sensor configured for detection of an operation of the operating element, and at least one light source;
- a control which is configured to switch the light source on or off subject to a sensor signal coming from the pressure sensor;
- at least one light conductor arranged close to the light source and configured to conduct light from the light source to at least a side of the light conductor remote from the carrier, and
- wherein provided on or close to the side of the light conductor remote from the carrier is a screen comprising at least one opaque part and at least one translucent part, which together form a symbol.

For the sake of completeness it is noted that in the context of the invention the following terms must be understood to mean the following: "opaque" is substantially or highly impermeable to light. "translucent" is substantially or highly permeable to light/clear, and "transparent" is substantially or highly clear.

When the sensor detects operation of the operating element, the control will switch a light source on or off subject to a sensor signal coming from the sensor. This light is conducted to a side of the light conductor remote from the carrier by a light conductor arranged close to the light source. The screen comprises at least one opaque part and at least one translucent part, which together form a symbol. The light from the light source will then light up a symbol on the operating element in switched-on mode of the light source.

A domestic appliance, for instance a hot water appliance, requires a robust and reliable operation, which is provided by the operating element according to the invention.

According to a preferred embodiment, the light conductor comprises a force-transmitting component. The light conductor thus fulfils on the one hand the function of conducting and spreading light, and on the other hand fulfils the function of transmitting/transferring a pressure force. The domestic appliance can hereby be provided with a robust operation with pressure sensors which is desired for such appliances, while having the look and feel of a high-end touch pad.

According to a further preferred embodiment, the light conductor has a height substantially corresponding to the height of an opaque side shield arranged adjacently thereof. The light conductor can hereby provide for a force transmission over the whole thickness of the opaque side shield. The pressure sensor is preferably arranged against the light conductor.

Although the side shield must in principle provide an opaque side shield only on the side facing toward the light conductor, the side shield is more preferably a component which is substantially wholly opaque.

According to a further preferred embodiment, a side of the light conductor remote from the carrier and a side of the side shield remote from the carrier are arranged substantially flush. A screen can hereby lie flat against the light conductor and the side shield, and a flat operating element is obtained.

According to yet another preferred embodiment, the substantially opaque side shield is provided at least between two light conductors. The operating element thus comprises at least two light conductors, wherein at least a substantially opaque side shield is provided between the light conductors. An operating element can thus be provided with at least two individually operable functions, such as a "plus" and "minus" mode for respectively raising or lowering a setting value. Because adjoining light conductors are separated from each other by opaque side shields, lateral scattering of light is prevented. Each symbol can hereby be provided with its own light source, and light is prevented from radiating from the one symbol to an adjacent other symbol.

According to yet another preferred embodiment, the operating element further comprises a transparent protective part which is arranged on the side of the screen remote from the carrier. This transparent protective part on one hand protects the underlying construction from outside influences. Contact between water or moisture and the electronics of the operating element can thus be prevented in a hot water appliance. The transparent protective part on the other hand shields the screen visually to some extent if the screen is not wholly transparent. The degree of transparency, i.e. the degree of light transmission, can be chosen precisely in order to show a visually flat wall in a mode in which the light sources are switched off and to show a visually clear view of a symbol in the mode in which a light source is switched on. The colour of the protective part, optionally in combination with the colour of the screen, determines the appearance of the operating element. It is possible to allow the symbols to light up relative to a surface of a random colour, as long as there is sufficient contrast between the symbol which lights up and the colour of the surface. An appliance can thus for instance be manufactured wholly in a white colour, wherein the symbols are difficult to see for or even not visible to the human eye when in switched-off mode, and light up in clearly visible manner in switched-on mode.

According to yet another preferred embodiment, the domestic appliance comprises at least two light conductors, wherein the protective part extends over at least two light conductors. The look and feel of a touch pad are in this way on the one hand achieved, wherein a plurality of functions actuable by pressure sensors are provided under one surface. A further advantage of the protective part extending over the light conductors is that it covers possible gaps. A reliable and moisture-resistant operating element can thus be provided, particularly for a domestic appliance such as a hot water appliance.

According to yet another preferred embodiment, the sensor is arranged close to the light source.

A compact construction in combination with a good force transmission is obtained if according to yet another preferred embodiment the light source is arranged adjacently of the light conductor.

Although it is possible to envisage that an optical sensor, which detects the approach of a hand or a movement of the hand and sends this on to the control unit for processing, is for instance provided, according to a further preferred embodiment the sensor is arranged close to the light source. Such a configuration enables a compact construction of the operating element.

Because the light conductor is substantially translucent, it can fulfil two functions. The light conductor on the one hand provides for conduction of the light, wherein the light conductor can if desired provide for a diffuse spreading of the light. The light conductor can on the other hand transmit a pressure force to a touch-sensitive (pressure) sensor.

According to yet another preferred embodiment, the screen comprises a substantially opaque strip with openings. The openings of course allow light through, wherein the opaque strip and the light-transmitting openings together form a symbol which is visible when the light source is switched on.

According to yet another preferred embodiment, the screen comprises a printed film, wherein printed parts form an opaque part of the screen and wherein unprinted parts form a substantially translucent part of the screen. A printed film on the one hand makes it possible to form very detailed symbols. A gradient in light transmission can on the other hand also be obtained by means of the degree of printing. A printed film can moreover form a screen with a very limited thickness.

According to yet another preferred embodiment, the screen is integrated with the light conductor. It is thus possible to envisage the light conductor itself being substantially translucent, and itself being provided with opaque parts on the side remote from the light source. These opaque parts can for instance be a print applied directly to the light conductor, i.e. without interposing of a film as described in the foregoing.

According to yet another preferred embodiment, the opaque side shield is a substantially opaque strip comprising passages for receiving the light conductors therein. Because adjoining light conductors are mutually separated by opaque side shields, lateral scattering of light is prevented. Each symbol can thereby be provided with its own light source, and light is prevented from radiating from the one symbol to an adjacent other symbol. The opaque side shield is preferably embodied as an opaque strip with passages, wherein the shape of the passages corresponds to the shape of associated light conductors so that these conductors can be received in the passages substantially free of play.

According to yet another preferred embodiment, the opaque strip comprises a recess for receiving the light source therein. The light source can be received in the recess, wherein there is free passage at least to the light conductor. Because the recess shields the light source on the other sides, the light can only shine toward the light conductor.

According to yet another preferred embodiment, the symbol corresponds to the function of an appliance for which the operating element is used. In the case of a hot water appliance a flame can thus be shown when the burner of the hot water appliance is switched on.

The invention further relates to an appliance comprising an operating element according to the invention.

The domestic appliance is preferably a hot water appliance and/or a thermostat associated therewith.

Preferred embodiments of the present invention are further elucidated in the following description with reference to the drawing, in which:

FIG. 4 is an exploded top view of a second preferred embodiment; and

FIG. 5 is an exploded side view of the second preferred embodiment shown in FIG. 4.

Figure 1:
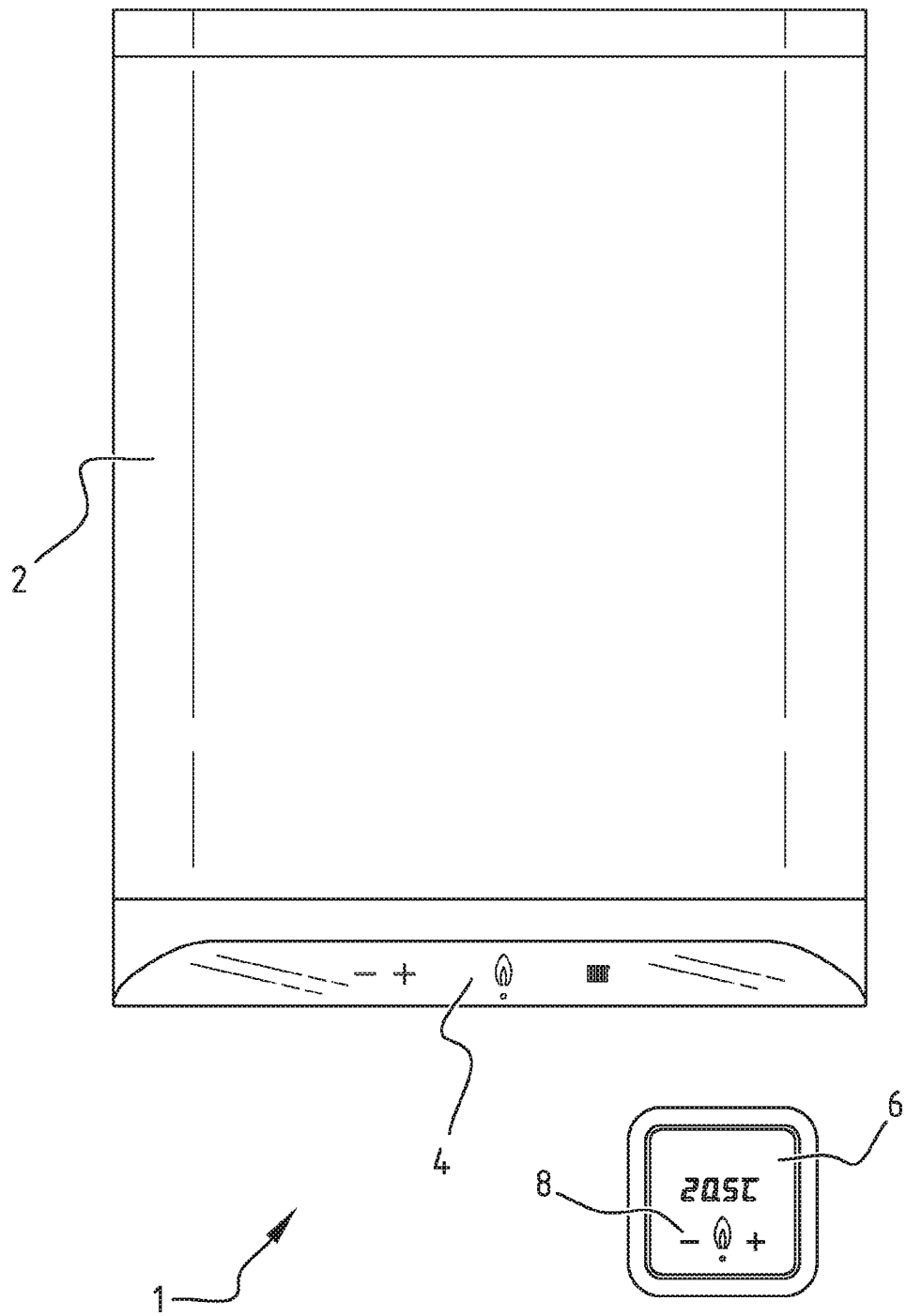
FIG. 1 is a hot water appliance and an associated thermostat which are provided with an operating element according to the invention.

Although an operating element 4, 8 according to the invention is suitable for many different types of appliance, a hot water appliance 2 and an associated thermostat 6 are shown in FIG. 1 as appliances 1. Provided in hot water appliance 2 is an operating element 4, while thermostat 6 is equipped with an operating element 8 with a differing form. The construction of operating elements 4, 8 can be identical from a technical viewpoint. The following figures therefore show only the operating element 4 of hot water appliance 2 in two different preferred embodiments. A first preferred embodiment is the subject of FIGS. 2 and 3, and a second preferred embodiment is shown in FIGS. 4 and 5.

In the description of the two above stated preferred embodiments similar measures are provided with similar reference numerals, so that unnecessary repetition is prevented. Although the two embodiments show many similarities, any differences between them will be further elucidated.

Figure 2:
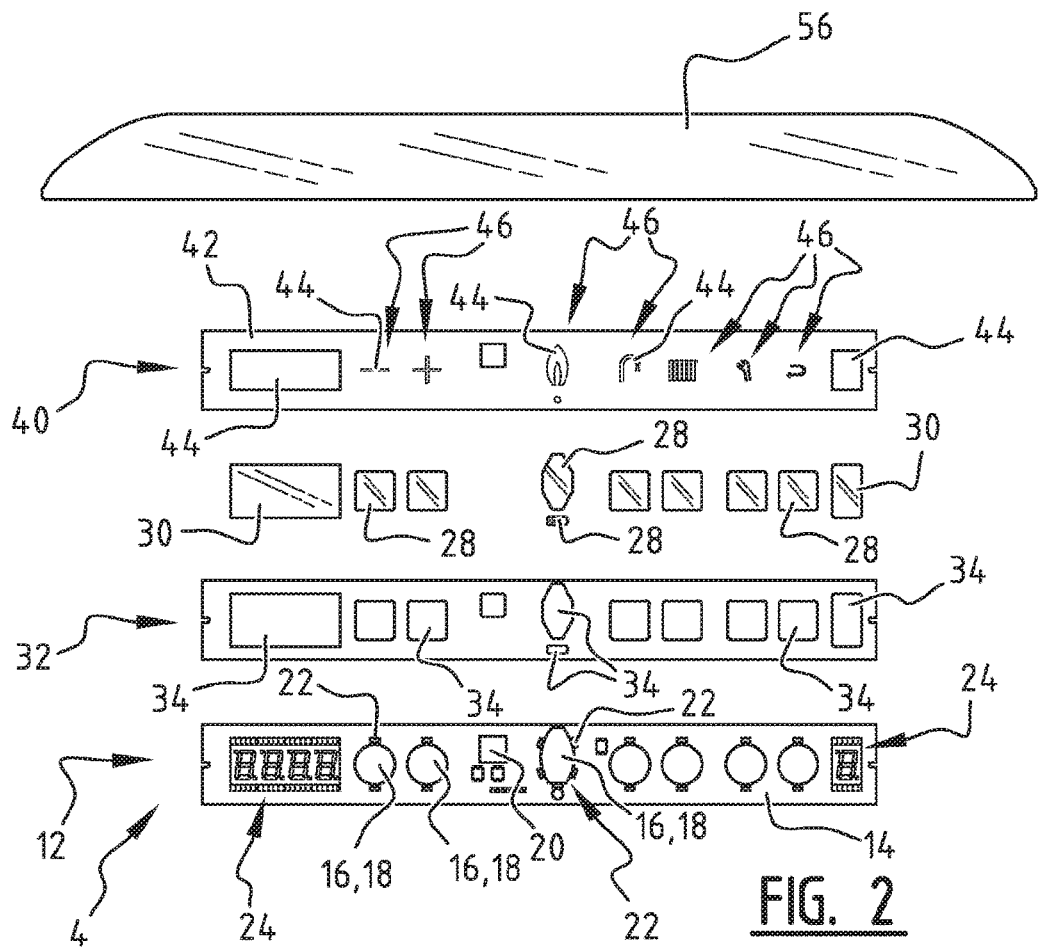
FIG. 2 is an exploded top view of a first preferred embodiment.

FIG. 2 shows an exploded top view of an operating element 4 according to the first preferred embodiment.

Operating element 4 comprises a carrier 12 which is embodied as a printed circuit board 14 in the shown embodiments. Printed circuit board 14 is provided with a sensor 16, which is a touch-sensitive sensor 18 such as a pressure sensor. When sensor 16 is operated, it sends a signal to control 20 which is configured to switch a light source 22 on or off subject to the sensor signal coming from sensor 16, 18.

An opaque shielding strip 32 is arranged on carrier 12. This shielding strip 32 has openings 34 in which light conductors 28 and windows 30 can be arranged. In the shown embodiment printed circuit board 14 is likewise provided with conventional screens 24, and opaque shielding strip 32 has at the position of these screens 24 openings 34 in which a window 30 can be placed. Screens 24 can for instance show a current temperature value.

Light conductors 28, which are configured to conduct light from light source 22 to a side of light conductor 28 remote from carrier 12, are placed in the other openings 34 of opaque shielding strip 32. Translucent light conductors 28 are physical elements which are arranged in openings 34 and provide two functionalities. Light conductor 28 on the one hand provides for the conducting and spreading of the light, wherein light conductor 28 can if desired provide for a diffuse spreading of the light. Light conductor 28 can on the other hand transmit a pressure force to a pressure sensor 16, 18.

Provided on or close to the side of light conductor 28 remote from carrier 12 is a screen 40 comprising at least one substantially opaque part 42 and at least one substantially translucent part 44, which together form a symbol 46.

Figure 3:
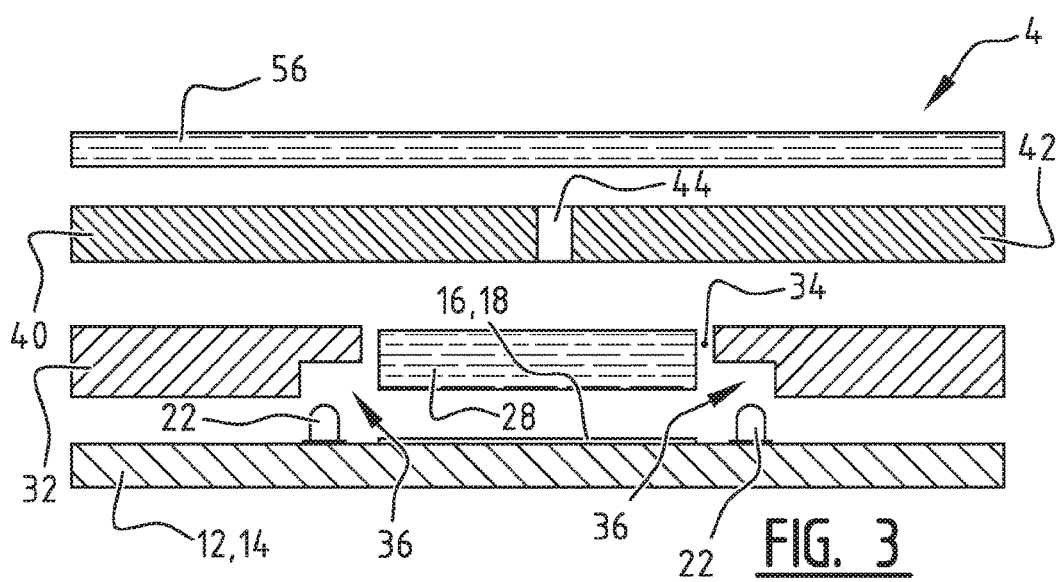
FIG. 3 is an exploded side view of the first preferred embodiment shown in FIG. 2.

In the first preferred embodiment shown in FIGS. 2 and 3, screen 40 is embodied as a substantially opaque strip 42 with openings which form a translucent part. The openings form together with the opaque part a symbol 46 which lights up when control 20 switches on the light source 22 associated with this specific symbol 46.

Provided on the side of screen 40 remote from carrier 12 is a substantially transparent protective part 56 which protects the underlying construction from outside influences, such as moisture or water, and which can be diffuse to limited extent in order to thus conceal symbols 46 and screen 40 from view when light sources 22 are switched off.

FIG. 3 shows an exploded side view of the operating element 4 shown in FIG. 2, wherein a light conductor 28 is received in an opening 34 of opaque shielding strip 32.

Opaque shielding strip 32 forms a side shield of the substantially translucent light conductors 28 and thus prevents light from a light source 22 being able to radiate via a light conductor 28 to an adjoining symbol 46. This prevents an adjoining symbol 46 from also lighting up to some extent.

As can also be seen in FIG. 3, opaque shielding strip 32 is provided with recesses 36 in which light source 22 can be received. Recesses 36 form a free passage at least on the side facing toward light conductor 28, so that light emitted by light source 22 can enter light conductor 28 and can be conducted and spread therethrough. This results in a compact construction. Meanwhile, light conductor 28 can be a substantially solid translucent component which transmits a limited bending of protective part 56 and screen 40 which is generated by a user to pressure sensor 18 in reliable manner. Light conductor 28 is arranged between pressure sensor 18 and a symbol 46 associated with the function of the relevant pressure sensor 18. A user who bends screen 40 to some extent at the position of symbol 46 using his or her finger thus compresses pressure sensor 18 via light conductor 28.

Screen 40 with opaque part 42 and translucent part 44 is provided on the side of opaque shielding strip 32 remote from printed circuit board 14 ('top' in the figure).

In the shown embodiment sensor 16 is a pressure sensor 18 which can be actuated by a force-transmitting light conductor 28 when a user generates a limited bending of protective part 56 and screen 40. Because light conductor 28 can display a symbol 46 of the function associated with the relevant sensor 18, an operating element 4 is created wherein a user can touch the symbol 46 which lights up him or herself for activating or deactivating the relevant function. Sensor 16 is a pressure sensor 18 which can be compressed when a user presses protective part 56 at the position of the relevant symbol 46. Protective part 56 will then bend to some extent and the pressure force will be transmitted via screen 40 and light conductor 28 to pressure-sensitive sensor 18. The sensor signal coming from sensor 16, 18 is then processed by control unit 20.

The second preferred embodiment which is shown in FIGS. 4 and 5 closely resembles the first embodiment of FIGS. 2 and 3. In this second preferred embodiment a printed film 48 is provided which has an opaque part 50 and a translucent part 52, and thus forms symbols 46. The advantage of a film 48 is that it enables symbols 46 to be detailed to an even higher degree, including application of a gradient in the light-permeability by a corresponding adjustment of the print on film 48. Film 48 can moreover function directly as screen 40, which makes it possible to realize an even more compact construction of the operating element.

It is also possible to envisage according to yet another, third preferred embodiment (not shown) that symbols 46 are arranged directly on light conductor 28, for instance as a print.

Although they show preferred embodiments of the invention, the above described embodiments are intended only to illustrate the present invention and not in any way to limit the specification of the invention. When measures in the claims are followed by reference numerals, such reference numerals serve only to contribute toward understanding of the claims, but are in no way limitative of the scope of protection. It is particularly noted that the skilled person can combine technical measures of the different embodiments. The rights described are defined by the following claims, within the scope of which many modifications can be envisaged.

The invention claimed is:

1. A domestic appliance with an operating element, the operating element comprising:
   a substantially planar carrier, provided with at least one touch-sensitive sensor configured for detection of an operation of the operating element, and at least one light source;
   a control which is configured to switch the light source on or off subject to a sensor signal received from the touch-sensitive sensor; and
   at least one diffusing light conductor arranged close to the light source and configured to conduct light from the light source to at least a side of the light conductor remote from the carrier;
   wherein provided on or close to the side of the light conductor remote from the carrier is a screen comprising at least one opaque part and at least one translucent part, which together form a symbol; and
   wherein:
   the at least one diffusing light conductor is arranged between said at least one light source and said at least one translucent part forming the symbol, the at least one diffusing light conductor is arranged between the touch-sensitive sensor and the symbol, the symbol corresponds to a function of the appliance for which the operating element is used; and the at least one light source is arranged offset in the plane of the carrier from the translucent part forming the symbol to prevent a direct view between the light source and the translucent part.

2. The domestic appliance according to claim 1, further comprising a transparent water protective part which is arranged on a side of the screen remote from the carrier.

3. The domestic appliance according to claim 1, wherein the light conductor comprises a force-transmitting component.

4. The domestic appliance according to claim 1, wherein the light conductor has a height substantially corresponding to a height of an opaque side shield arranged adjacently thereof.

5. The domestic appliance according to claim 1, wherein a side of the light conductor remote from the carrier and a side of the side shield remote from the carrier are arranged substantially flush with each other.

6. The domestic appliance according to claim 4, wherein the substantially opaque side shield is provided at least between two light conductors.

7. The domestic appliance according to claim 2, comprising at least two light conductors, wherein the protective part extends over at least two light conductors.

8. The domestic appliance according to claim 1, wherein the sensor is arranged close to the light source.

9. The domestic appliance according to claim 1, wherein the light source is arranged adjacently of the light conductor.

10. The domestic appliance according to claim 1, wherein the light conductor is substantially translucent.

11. The domestic appliance according to claim 1, wherein the screen comprises a substantially opaque strip with openings.

12. The domestic appliance according to claim 1, wherein the screen comprises a printed film.

13. The domestic appliance according to claim 1, wherein the screen is integrated with the light conductor.

14. The domestic appliance according to claim 4, wherein the opaque side shield is a substantially opaque strip comprising passages for receiving the light conductors therein.

15. The domestic appliance according to claim 14, wherein the opaque strip comprises a recess for receiving the light source therein.

16. The domestic appliance according to claim 1, wherein the symbol corresponds to the function of an appliance for which the operating element is used.

17. The domestic appliance according to claim 1, wherein the domestic appliance is at least one of a hot water appliance and a thermostat associated therewith.

18. The domestic appliance according to claim 1, wherein the at least one diffusing light conductor prevents direct transmission of light from the at least one light source to the at least one translucent part.

19. The domestic appliance according to claim 1, wherein the at least one light source comprises first and second light sources, and the at least one diffusing light conductor spreads and diffuses light from the first and second light sources and transmits the spread and diffuse light to the at least one translucent part.

20. The domestic appliance according to claim 1, wherein the touch-sensitive sensor is a pressure sensor.

* * * * *